US011127618B2

United States Patent
Li (10) Patent No.: US 11,127,618 B2
(45) Date of Patent: Sep. 21, 2021

(54) SYSTEM FOR DYNAMICALLY COMPENSATING POSITION ERRORS OF A SAMPLE

(71) Applicant: ASML Netherlands B.V., AH Veldhoven (NL)

(72) Inventor: Fangfu Li, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 205 days.

(21) Appl. No.: 16/329,666

(22) PCT Filed: Aug. 26, 2017

(86) PCT No.: PCT/EP2017/071477
§ 371 (c)(1),
(2) Date: Feb. 28, 2019

(87) PCT Pub. No.: WO2018/041744
PCT Pub. Date: Mar. 8, 2018

(65) Prior Publication Data
US 2019/0198372 A1    Jun. 27, 2019

Related U.S. Application Data

(60) Provisional application No. 62/380,704, filed on Aug. 29, 2016, provisional application No. 62/413,543, (Continued)

(51) Int. Cl.
*G06F 7/00* (2006.01)
*H01L 21/68* (2006.01)
(Continued)

(52) U.S. Cl.
CPC .......... *H01L 21/681* (2013.01); *H01J 37/185* (2013.01); *H01J 37/226* (2013.01);
(Continued)

(58) Field of Classification Search
CPC .............. H01L 21/681; H01L 21/67213; H01J 37/226; H01J 37/185; H01J 2237/204; H01J 2237/20285; H01J 2237/20292
(Continued)

(56) References Cited

U.S. PATENT DOCUMENTS

| 2007/0023684 A1 | 2/2007 | Lewis et al. |
| 2009/0196717 A1 | 8/2009 | Holden |

(Continued)

FOREIGN PATENT DOCUMENTS

| JP | 09147778 A | * | 6/1997 |
| JP | H09-147778 A | | 6/1997 |

(Continued)

OTHER PUBLICATIONS

Office Action and Search Report issued from the Intellectual Property Office of ROC Taiwan Patent Application No. 106129290 dated Dec. 19, 2018 (7 pages).

(Continued)

*Primary Examiner* — Yolanda R Cumbess
(74) *Attorney, Agent, or Firm* — Finnegan, Henderson, Farabow, Garrett & Dunner, LLP (57) ABSTRACT

Systems and methods are provided for dynamically compensating position errors of a sample. The system can comprise one or more sensing units configured to generate a signal based on a position of a sample and a controller. The controller can be configured to determine the position of the sample based on the signal and in response to the determined position, provide information associated with the determined position for control of one of a first handling unit in a first chamber, a second handling unit in a second chamber, and a beam location unit in the second chamber.

15 Claims, 10 Drawing Sheets

Related U.S. Application Data filed on Oct. 27, 2016, provisional application No. 62/549,413, filed on Aug. 23, 2017.

(51) Int. Cl.
  *H01J 37/18* (2006.01)
  *H01L 21/67* (2006.01)
  *H01J 37/22* (2006.01)

(52) U.S. Cl.
  CPC .. *H01L 21/67213* (2013.01); *H01J 2237/204* (2013.01); *H01J 2237/20285* (2013.01); *H01J 2237/20292* (2013.01)

(58) Field of Classification Search
  USPC .................................. 700/213, 245, 254
  See application file for complete search history.

(56) References Cited

U.S. PATENT DOCUMENTS

| | | | |
|---|---|---|---|
| 2016/0284508 A1* | 9/2016 | Carson | H01L 21/67282 |
| 2017/0040203 A1* | 2/2017 | Caveney | H01L 21/68707 |

FOREIGN PATENT DOCUMENTS

| | | | |
|---|---|---|---|
| JP | 2000-323080 A | 11/2000 |
| TW | 200947591 A1 | 11/2009 |
| TW | 201034111 A1 | 9/2010 |

OTHER PUBLICATIONS

International Search Report and Written Opinion dated Mar. 1, 2018, for corresponding PCT International Application No. PCT/EP2017/071477 (9 pages).

* cited by examiner

SYSTEM FOR DYNAMICALLY COMPENSATING POSITION ERRORS OF A SAMPLE

CROSS-REFERENCE TO RELATED APPLICATIONS

This application is a national stage filing under 35 U.S.C. § 371 of International Application No. PCT/EP2017/071477, filed on Aug. 26, 2017, and published as WO 2018/041744 A2, which claims priority of U.S. application 62/380,704, which was filed on Aug. 29, 2016; U.S. application 62/413,543, which was filed on Oct. 27, 2016; and U.S. application 62/549,413, which was filed on Aug. 23, 2017. The contents of these applications are each incorporated herein by reference in their entirety.

TECHNICAL FIELD

The present disclosure generally relates to systems and methods for determining position of a sample, and more particularly, to systems and methods for dynamically compensating position errors of a sample.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to a sub-100 or even sub-10 nanometers, inspection systems capable of higher resolution than those utilizing optical microscopes are needed.

A charged particle (for example, an electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With an SEM, electrons of a single primary electron beam, or electrons of a plurality of primary electron beams, can be focused at one or more scan locations of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and/or external structures of the wafer.

At atmospheric pressure, the charged particles (e.g., electrons) suffer frequent collisions with gas molecules and are deflected from their path. The mean free path of charged particles at atmospheric pressure can be too small for practical inspection applications. A chamber housing a charged particle beam microscope is therefore evacuated to a low pressure value (high vacuum level) before using the charged particle beam for inspection.

A load/lock chamber can be used to isolate the low pressure chamber housing the charged particle beam microscope from atmospheric pressure. A wafer can be transferred by a first robot from a load port to the load/lock chamber. A second robot can transfer the wafer from the load/lock chamber to the chamber housing the charged particle beam. Position errors, however, can occur during one or both of the transfers. The position errors can cause misprocessing of the wafer.

In some cases, the position errors can cause breakage of the wafer thereby reducing the semiconductor manufacturing yield. In some systems, the position errors can be corrected after unloading the wafer and loading the wafer again with the corrected position. But this can cause significant time delays and reduce the throughput of the semiconductor manufacturing process.

And in some systems, a second calibration wafer can be used to determine a drift value between the first wafer and the calibration wafer. However, the determined drift is a relative measurement and can be less reliable compared with an absolute position measurement. Further, using two wafers also can cause significant time delays and can reduce the throughput of the semiconductor manufacturing process.

SUMMARY

Embodiments of the present disclosure provide systems and methods for dynamically compensating position errors of a sample. In some embodiments, a system is provided. The system comprises one or more sensing units configured to generate a signal based on a position of a sample and a controller. The controller can be configured to determine the position of the sample based on the signal and in response to the determined position, provide information associated with the determined position for control of one of a first handling unit in a first chamber, a second handling unit in a second chamber, and a beam location unit in the second chamber.

In some embodiments, a method for determining a position of a sample in an interface between a first chamber and a second chamber is provided. The method comprises generating a signal based on the position of the sample; determining the position of the sample based on the signal; and in response to the determined position, providing information associated with the determined position for control of one of a first handling unit in the first chamber, a second handling unit in the second chamber or a beam location unit in the second chamber.

In some embodiments, a non-transitory computer readable storage medium storing a set of instructions that is executable by one or more processors of a computing device to cause the computing device to perform a method is provided. The method comprises receiving a signal from one or more sensory units, wherein the signal is based on a position of a sample in an interface between a first chamber and a second chamber; determining the position of the sample based on the received signal; and in response to the determined position, providing information associated with the determined position for control of one of a first handling unit in the first chamber, a second handling unit in the second chamber or a beam location unit in the second chamber.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The present disclosure relates to systems and methods for dynamically compensating position errors of a sample. Embodiments of the present disclosure provide one or more sensing units configured to generate a signal based on a position of a sample and a controller configured to determine the position of the sample based on the signal. In response to the determined position, the controller can be configured to provide associated information for control of one of a first handling unit in a first chamber, a second handling unit in a second chamber, and a beam location unit in the second chamber system provide. Any wafer position errors can be detected and corrections can be made without the wafer being unloaded and reloaded. With such arrangements, the disclosed embodiments can improve the accuracy of wafer transfers and the throughput of the process. Also, improved accuracy of wafer transfers can help increase the semiconductor manufacturing yield.

Figure 1:
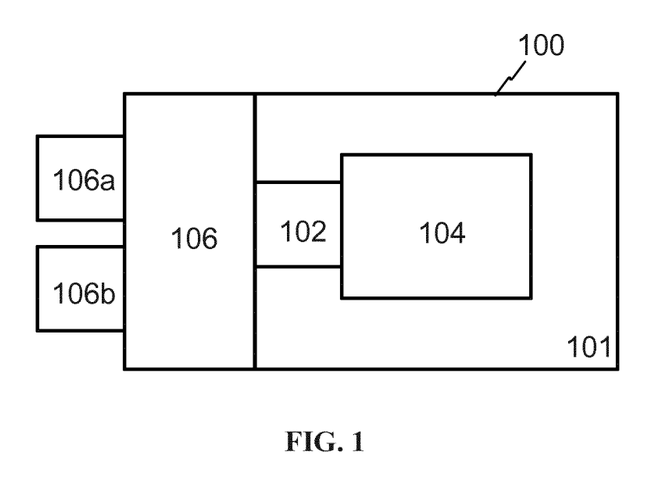
FIG. 1 is a schematic diagram illustrating an exemplary electron beam inspection (EBI) system, consistent with embodiments of the present disclosure.

Reference is now made to FIG. 1, which illustrates an exemplary electron beam inspection (EBI) system 100 consistent with embodiments of the present disclosure. As shown in FIG. 1, EBI system 100 includes a main chamber 101, a load/lock chamber 102, an electron beam tool 104, and an equipment front end module (EFEM) 106. Electron beam tool 104 is located within main chamber 101.

EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 106 transport the wafers to load/lock chamber 102.

Load/lock chamber 102 is connected to a load/lock vacuum pump system (not shown), which removes gas molecules in load/lock chamber 102 to reach a first pressure below the atmospheric pressure. After reaching the first pressure, one or more robot arms (not shown) transport the wafer from load/lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to inspection by electron beam tool 104. While the present disclosure provides examples of main chamber 101 housing an electron beam inspection system, it should be noted that aspects of the disclosure in their broadest sense, are not limited to a chamber housing an electron beam inspection system. Rather, it is appreciated that the forgoing principles may be applied to other chambers as well.

Figure 2:
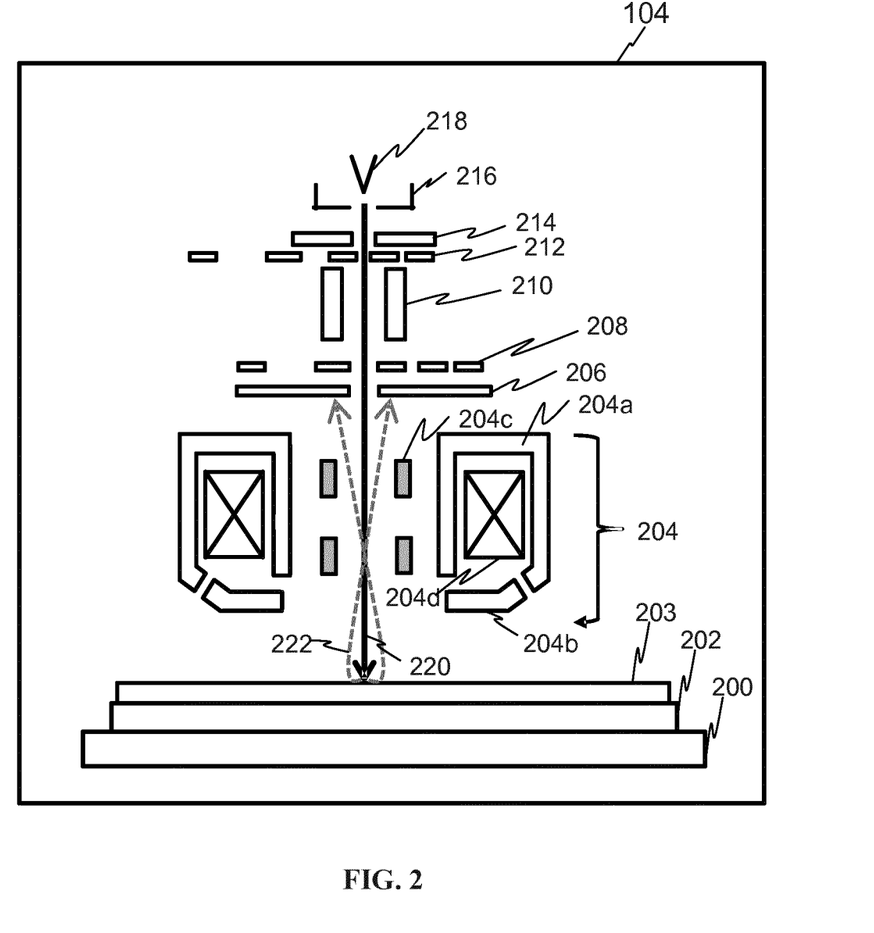
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates exemplary components of electron beam tool 104 consistent with embodiments of the present disclosure. As shown in FIG. 2, electron beam tool 104 includes a motorized stage 200, and a wafer holder 202 supported by motorized stage 200 to hold a wafer 203 to be inspected. Electron beam tool 104 further includes an objective lens assembly 204, electron detector 206, an objective aperture 208, a condenser lens 210, a beam limit aperture 212, a gun aperture 214, an anode 216, and a cathode 218. Objective lens assembly 204, in some embodiments, can include a modified swing objective retarding immersion lens (SORIL), which includes a pole piece 204a, a control electrode 204b, a deflector 204c, and an exciting coil 204d. Electron beam tool 104 may additionally include an energy dispersive X-ray spectrometer (EDS) detector (not shown) to characterize the materials on the wafer.

A primary electron beam 220 is emitted from cathode 218 by applying a voltage between anode 216 and cathode 218. Primary electron beam 220 passes through gun aperture 214 and beam limit aperture 212, both of which can determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c can be controlled to deflect primary electron beam 220 sequentially onto different locations of top surface of wafer 203 at different time points, to provide data for image reconstruction for different parts of wafer 203. Further, in some embodiments, anode 216 and cathode 218 can be configured to generate multiple primary electron beams 220, and electron beam tool 104 can include a plurality of deflectors 204c to project the multiple primary electron beams 220 to different portions of the wafer at the same time, to provide data for image reconstruction for different portions of wafer 203.

Exciting coil 204d and pole piece 204a generate a magnetic field that begins at one end of pole piece 204a and terminates at the other end of pole piece 204a. A part of wafer 203 being scanned by primary electron beam 220 can be immersed in the magnetic field and can be electrically charged, which, in turn, creates an electric field. The electric field reduces the energy of impinging primary electron beam 220 near the surface of the wafer before it collides with the wafer. Control electrode 204b, being electrically isolated from pole piece 204a, controls an electric field on the wafer to prevent micro-arching of the wafer and to ensure proper beam focus.

A secondary electron beam 222 can be emitted from the part of wafer 203 upon receiving primary electron beam 220. Secondary electron beam 222 can form a beam spot on sensor surfaces of electron detector 206. Electron detector 206 can generate a signal (e.g., a voltage, a current, etc.) that represents an intensity of the beam spot, and provide the signal to a processing system (not shown in FIG. 2). The intensity of secondary electron beam 222, and the resultant beam spot, can vary according to the external and/or internal structure of wafer 203. Moreover, as discussed above, primary electron beam 220 can be projected onto different locations of the surface of the wafer, to generate secondary electron beams 222 (and the resultant beam spot) of different intensities. Therefore, by mapping the intensities of the beam spots with the locations of wafer 203, the processing system can reconstruct an image that reflects the internal and/or external structures of wafer 203.

Figure 3:
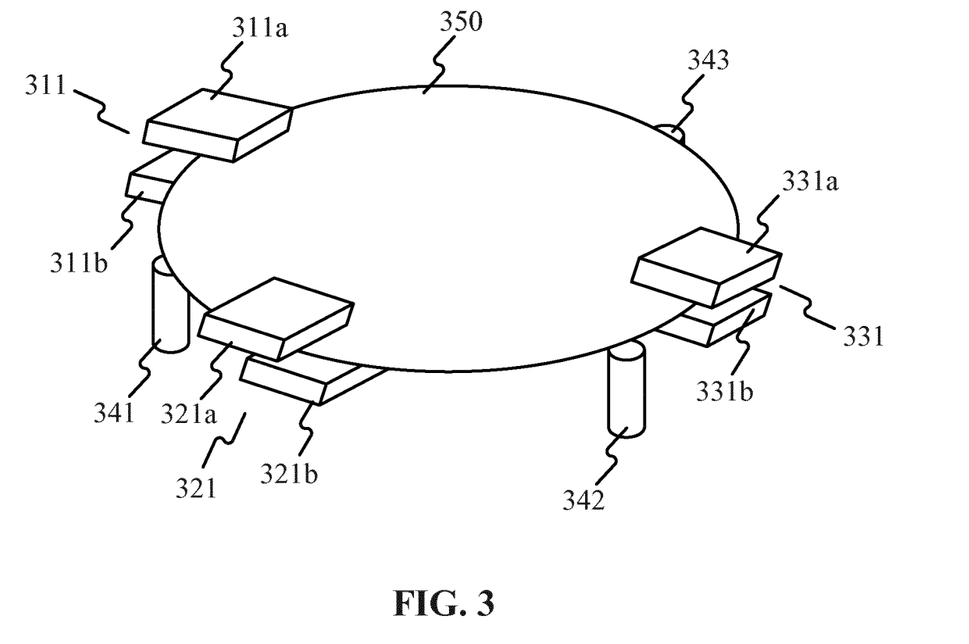
FIG. 3 is a schematic diagram illustrating exemplary sensing units for detecting a position of a wafer, consistent with embodiments of the present disclosure.

Reference is now made to FIG. 3, which is a schematic diagram illustrating exemplary sensing units 311, 321, and 331 for detecting a position of a wafer 350, consistent with embodiments of the present disclosure. Each sensing unit can comprise an emitter configured to emit light and a sensor configured to detect the emitted light. Sensing unit 311 comprises sensor 311a and emitter 311b, sensing unit 321 comprises sensor 321a and emitter 321b, sensing unit 331 comprises sensor 331a and emitter 331b. Wafer 350 can be present in a chamber (e.g., load/lock chamber 102 of FIG. 1) and supported by three seats 341, 342, and 343. Sensing units 311, 321, and 331 can be through type sensing units and positioned along the edge of wafer 350. Sensors 311a, 321a, and 331a can be positioned on top of wafer 350 and corresponding emitters 311b, 321b, and 331b can be positioned beneath wafer 350, or vice versa. The amount of light from an emitter (e.g., emitter 311b) detected by a sensor (e.g., sensor 311a) can be a function of position of wafer 350.

Figure 4A:
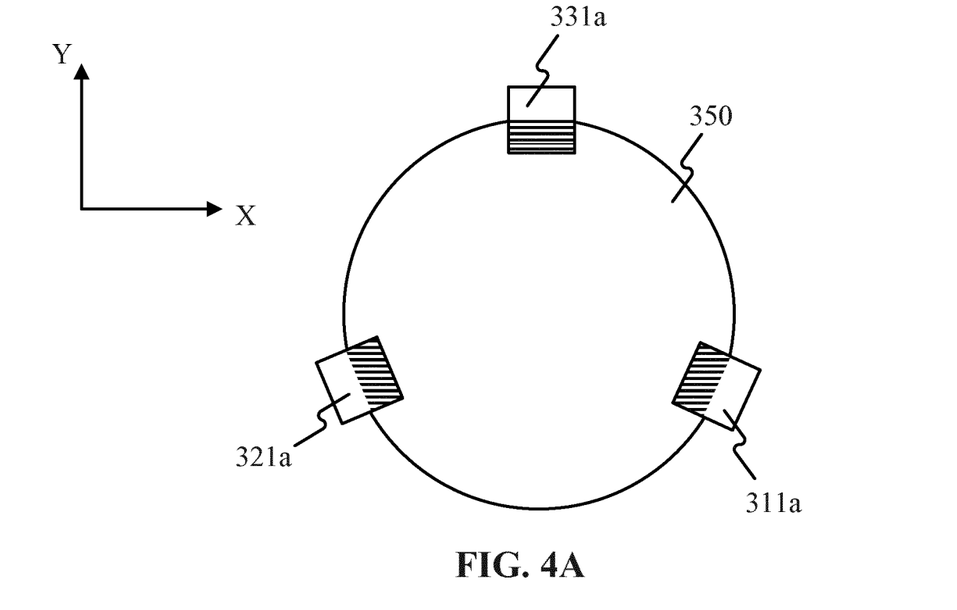
FIGS. 4A, 4B are schematic diagrams illustrating light detection by exemplary sensors corresponding to a position of a wafer, consistent with embodiments of the present disclosure.

Reference is now made to FIG. 4A, which is a schematic diagram illustrating light detection by exemplary sensors 311a, 321a, and 331a of FIG. 3 corresponding to position of wafer 350, consistent with embodiments of the present disclosure. In some embodiments, sensing units 311, 321, and 331 can be arranged wherein sensors 311a, 321a, and 331a detect approximately 50% of light emitted by corresponding emitters 311b, 321b, and 331b for wafer 350 positioned correctly on seats 341, 342, and 343. In some embodiments, one or more of the sensing units can be arranged for the sensors to detect a greater amount of light (e.g., 60%, 70%, 80%, 90%, 100%) emitted by the corresponding emitters for wafer 350 positioned correctly on seats 341, 342, and 343. In some embodiments, one or more of the sensing units can be arranged for the sensors to detect a smaller amount of light (e.g., 10%, 20%, 30%, 40%) emitted by the corresponding emitters for wafer 350 positioned correctly on seats 341, 342, and 343. Sensing units 311, 321, and 331 can generate electrical signals corresponding to the amount of detected light and provide the signals to a controller (not shown in FIG. 4A).

Figure 4B:
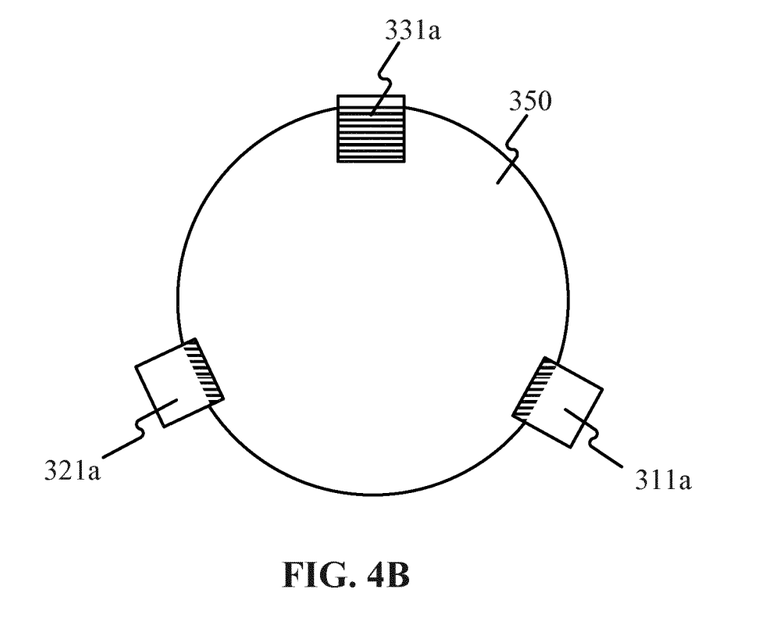

Reference is now made to FIG. 4B, which is a schematic diagram illustrating light detection by exemplary sensors 311a, 321a, and 331a corresponding to position of wafer 350, consistent with embodiments of the present disclosure. In comparison with FIG. 4A, wafer 350 is shifted in the Y direction and not correctly positioned on seats 341, 342, and 343. This can cause sensors 311a and 321a to detect greater than 50% of light emitted by corresponding emitters 311b and 321b and also cause sensor 331a to detect lower than 50% of light emitted by corresponding emitter 331b. Sensing units 311, 321, and 331 can generate corresponding electrical signals proportional to the amount of detected light and provide the signals to a controller (not shown in FIG. 4B). The signals generated by sensing units 311, 321, and 331 can therefore provide an indication of position of wafer 350. While three sensing units are displayed in FIGS. 3 & 4A-B, it is appreciated that any number of sensing units can be used. For instance, a single, relatively larger sensing unit could be used to accurately predict the position of the wafer.

Figure 5:
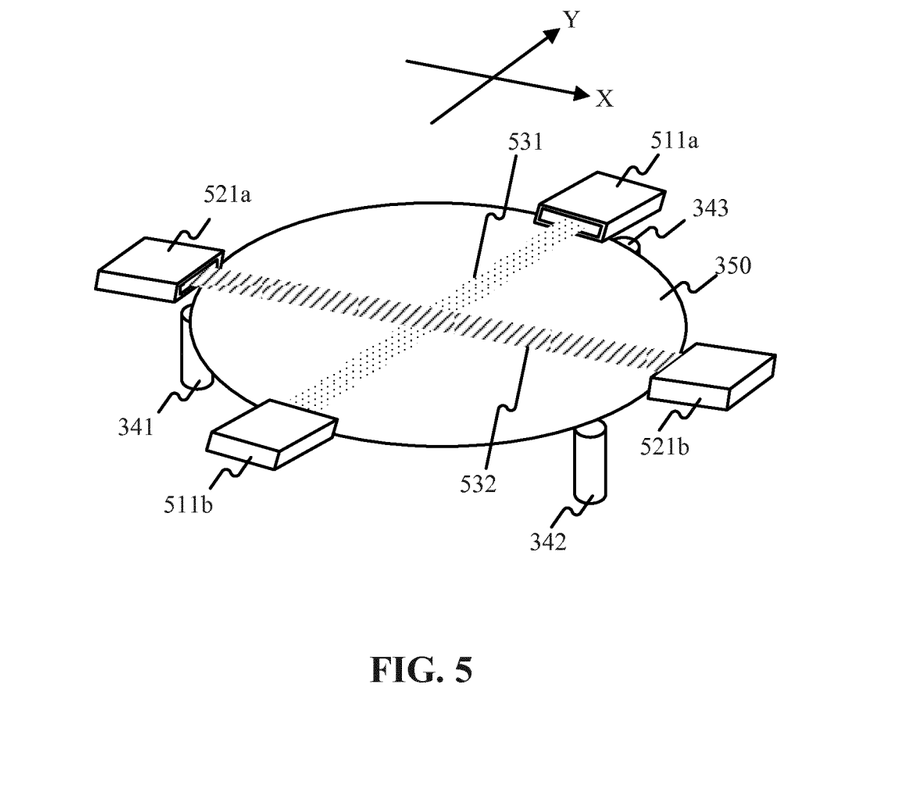
FIG. 5 is a schematic diagram illustrating exemplary sensing units for detecting position of a wafer, consistent with embodiments of the present disclosure.

Reference is now made to FIG. 5, which is a schematic diagram illustrating exemplary sensing unit 511 (comprising sensor 511a and emitter 511b) and exemplary sensing unit 521 (comprising sensor 521a and emitter 521b) for detecting a position of a wafer 350, consistent with embodiments of the present disclosure. As illustrated in FIG. 5, sensing units 511 and 521 can be placed along the edge of the wafer to determine a tilt of wafer 350 with respect to an X-Y plane. For correct placement of wafer 350 on seats 341, 342, and 343, the tilt of wafer 350 with respect to the X-Y plane is zero. Sensors 511a and 521a can be arranged to detect all or almost 100% of light beams 531 and 532 emitted by corresponding emitters 511b and 521b. Moreover, it is appreciated that while two sensing units are shown, any number of sensing units could be used to determine the position of wafer 350.

Figure 6:
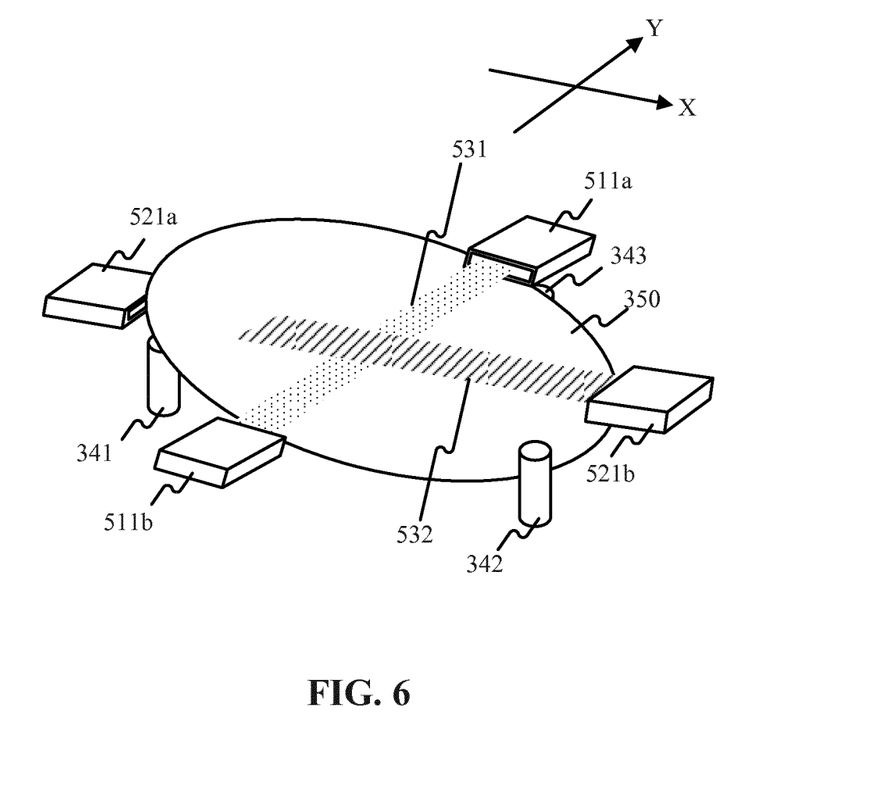
FIG. 6 is a schematic diagram illustrating light detection by exemplary sensors corresponding to a position of a wafer, consistent with embodiments of the present disclosure.

Reference is now made to FIG. 6, which is a schematic diagram illustrating light detection by exemplary sensors 511a and 521a of FIG. 5 corresponding to a position of wafer 350, consistent with embodiments of the present disclosure. In comparison with FIG. 5, wafer 350 is not positioned correctly in the X direction on seats 341, 342, and 343. Wafer 350 is tilted with respect to the X-Y plane and can block some or all of light beam 532 from emitter 521b reaching sensor 521a. Sensing unit 521 can generate a corresponding electrical signal indicating an error in position of wafer 350. Sensing unit 521 can provide the generated electrical signal to a controller (not shown in FIG. 4A).

Figure 7:
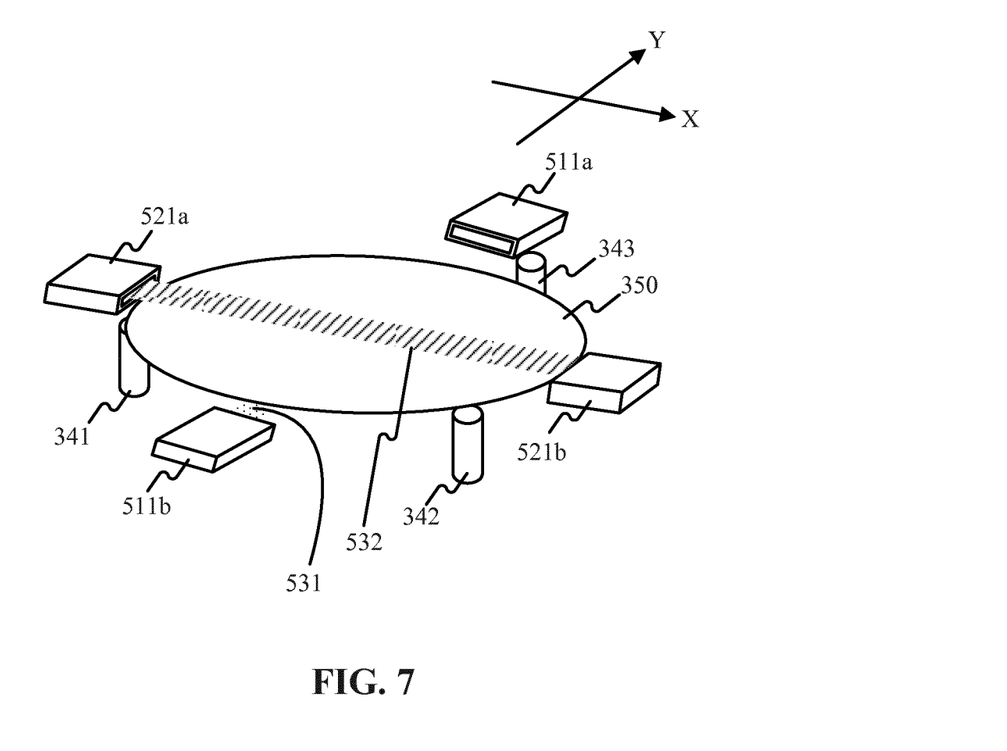
FIG. 7 is a schematic diagram illustrating light detection by exemplary sensors corresponding to a position of a wafer, consistent with embodiments of the present disclosure.

Reference is now made to FIG. 7, which is a schematic diagram illustrating light detection by exemplary sensors 511a and 521a of FIG. 5 corresponding to a position of wafer 350, consistent with embodiments of the present disclosure. In comparison with FIG. 5, wafer 350 is not positioned correctly in the Y direction on seats 341, 342, and 343. Wafer 350 is tilted with respect to the X-Y plane and can block some or all of light beam 531 from emitter 511b reaching sensor 511a. Sensing unit 511 can generate a corresponding electrical signal indicating an error in position of wafer 350. Sensing unit 511 can provide the generated electrical signal to a controller (not shown in FIG. 4A).

Figure 8:
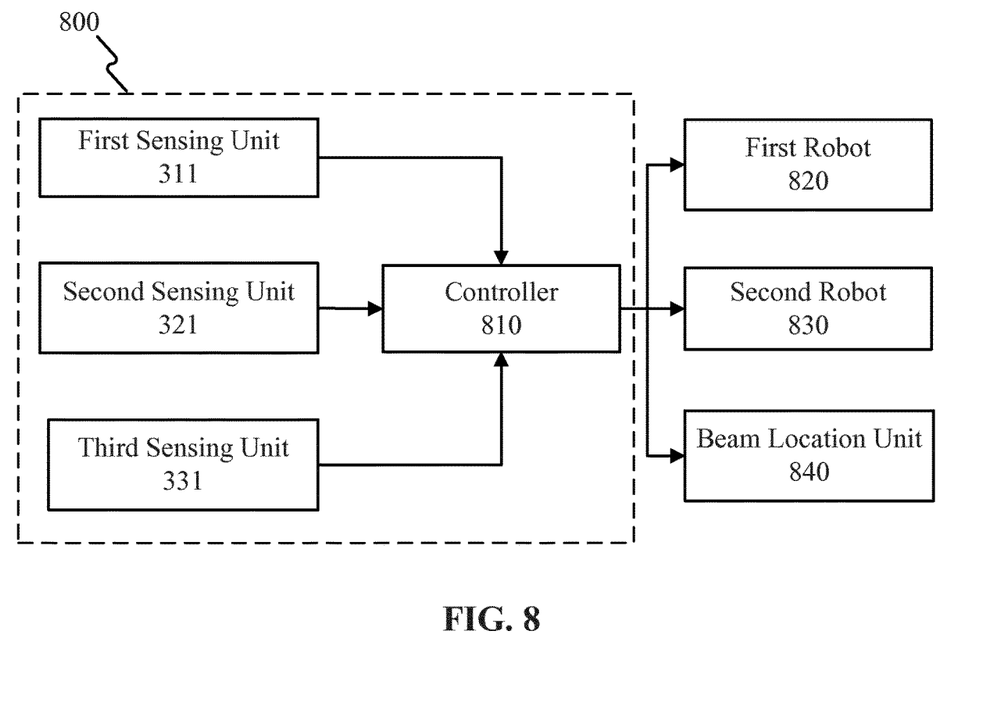
FIG. 8 is a schematic diagram illustrating an exemplary system for detecting a position of a wafer and dynamically compensating for any errors in the detected position, consistent with embodiments of the present disclosure.

Reference is now made to FIG. 8, which is a schematic diagram illustrating an exemplary system 800 for detecting position of a wafer and dynamically compensating for any errors in the detected position, consistent with embodiments of the present disclosure. System 800 can comprise a controller 810 and one or more sensing units, for example, sensing units 311, 321, and 331. Controller 810 can comprise one or more modules, which can be a packaged functional hardware unit designed for use with other components (for example, portions of an integrated circuit) or a part of a program (stored on a computer readable medium) that performs a particular function of related functions. The module can have entry and exit points and can be written in a programming language, such as, for example, Java, Lua, C or C++. A software module can be compiled and linked into an executable program, installed in a dynamic link library, or written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, cache, register, or any other non-transitory medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in firmware, such as an EPROM. It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware.

Sensing units 311, 321, and 331 (shown) and/or sensing units 511 and 521 (not shown) can detect the position of a wafer (e.g., wafer 350) and generate corresponding electrical signals, as described with reference to FIGS. 3-7. Sensing units 311, 321, and 331 and/or sensing units 511 and 521 can provide the generated electrical signal to controller 810. Controller 810 can calculate a shift vector based on a difference between the detected position of wafer 350 and the desired position of wafer 350. Using the shift vector, controller 810 can compensate for an error in position of wafer 350 by controlling first robot 820 or second robot 830 to adjust the position of wafer 350 or by controlling beam location unit 840 to compensate based on the detected position of wafer 350.

Figure 9:
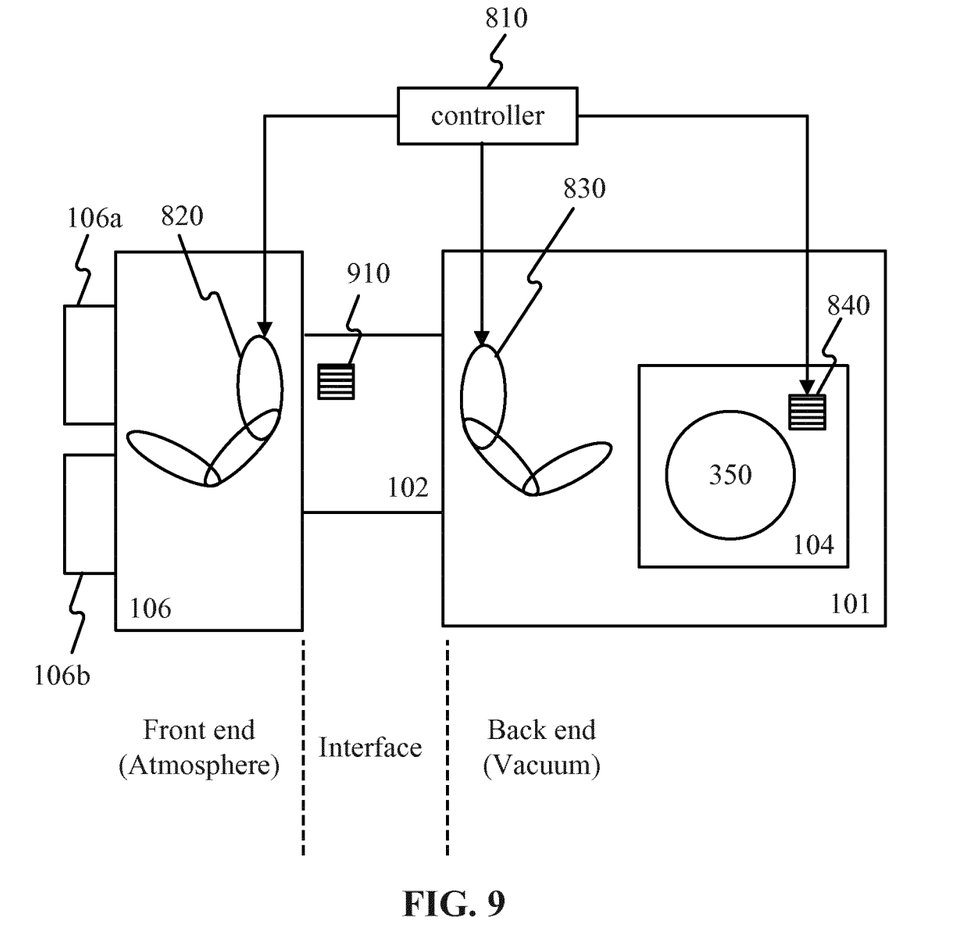
FIG. 9 is a schematic diagram illustrating location of a first robot, a second robot, and a beam location unit within an exemplary EBI system, consistent with embodiments of the present disclosure.

Reference is now made to FIG. 9, which is a schematic diagram illustrating location of first robot 820, second robot 830, a wafer location unit 910 of load/lock chamber 102, and a beam location unit 840 within exemplary EBI system 100, consistent with embodiments of the present disclosure.

First robot 820 can transfer wafer 350 between EFEM 106 and load/lock chamber 102. For example, first robot 820 can provide wafer to beam location unit 910, which can include wafer location unit 910 communicatively coupled to controller 810. Wafer location unit 910 can include seats 341, 342, and 343, along with sensing units 311, 321, and 331, and/or sensing units 511 and 521. Location unit 910 can then evaluate the position of wafer and provide the corresponding data to controller 810. Controller 810 can determine a shift vector, as described above, based on the position of the wafer relative to the sensing units.

Second robot 830 can transfer wafer 350 between load/lock chamber 102 and electron beam tool 104. For example, after determining the shift vector, controller 810 can assist second robot 830 with acquiring and transferring wafer 350 from load/lock chamber 102 to electron beam tool 104. During transfer of wafer 350 from load/lock chamber 102 to electron beam tool 104, controller 810 can control one of second robot 830 and beam location unit 840, based on the calculated shift vector. For a case where the calculated shift vector is greater than a threshold value, controller 810 can control second robot 830. For example, the calculated shift vector can indicate that wafer 350 is shifted in Y direction by $Y_1$ distance units compared with the correct position, wherein $Y_1$ is greater than the threshold value. Controller 810 can control transfer of wafer 350 by making corresponding adjustments to motion of second robot 830. For a case where the calculated shift vector is smaller than a threshold value, controller 810 can control beam location unit 840. For example, the calculated shift vector can indicate that wafer 350 is shifted in Y direction by $Y_2$ distance units compared with the correct position, wherein $Y_2$ is smaller than the threshold value. Controller 810 can control beam location unit 840 to make corresponding adjustments to one or more primary electron beams of electron beam tool 104.

Moreover, second robot 830 can transfer the wafer from electron beam tool 104 to beam location unit 910 of load/lock chamber 102. Beam location unit 910 can then evaluate the position of wafer and provide the corresponding position data to controller 810. Using the position data, controller 810 can determine a shift vector, as described above, based on the position of the wafer relative to the sensing units.

First robot 820 can transfer wafer 350 from load/lock chamber 102 to EFEM 106. Controller 810 can control first robot 820 based on a calculated shift vector during transfer of wafer 350 from load/lock chamber 102 to EFEM 106. For example, the calculated shift vector can indicate that wafer 350 is shifted in X direction by $X_1$ distance units compared with the correct position. Controller 810 can control transfer of wafer 350 by making corresponding adjustments to motion of first robot 820.

It is appreciated that if the wafer is detected to be tilted, controller 810 can assist first robot 820 and second robot 830 with making appropriate adjustments to acquire wafer 350.

Figure 10:
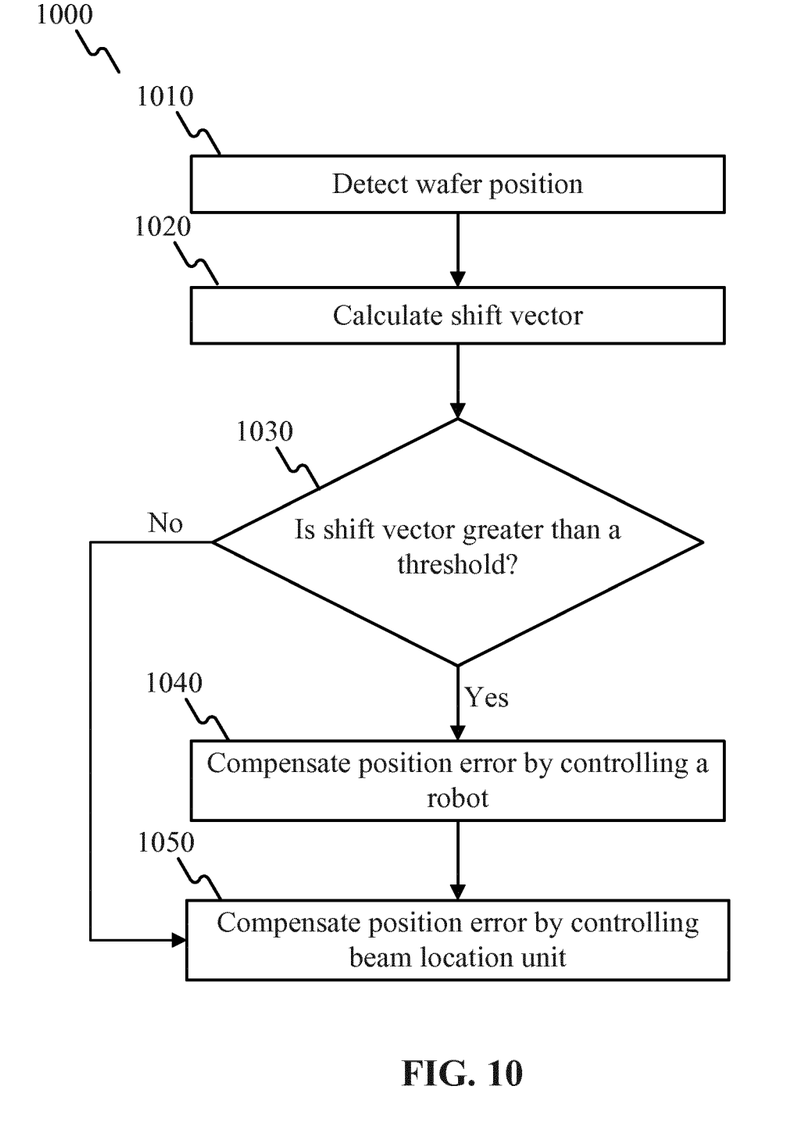
FIG. 10 is a flowchart illustrating an exemplary method for determining a position of a wafer in an interface between a first chamber and a second chamber, consistent with embodiments of the present disclosure.

Reference is now made to FIG. 10, which is a flowchart illustrating an exemplary method 1000 for determining a position of a wafer in an interface between a first chamber and a second chamber, consistent with embodiments of the present disclosure. As an example, method 1000 can be performed by a system (e.g., system 800 of FIG. 8). It will be readily appreciated that the illustrated procedure can be altered to modify the order of steps, delete steps, or further include additional steps.

After an initial start, the system can detect position of the wafer in step 1010. For example, sensing units 311, 321, and 331 of system 800 can generate electrical signals corresponding to position of the wafer. The sensing units can provide the generated electrical signals to a controller (e.g, controller 810 of system 800).

In step 1020, the controller can calculate a shift vector based on the detected wafer position and the correct wafer position. For example, referring to FIG. 4B, the controller can calculate a shift vector indicating wafer is shifted in Y direction compared with the correct wafer position in FIG. 4A.

In step 1030, the controller can determine whether the shift vector is greater than a threshold value. The shift vector can be set based upon different system properties, e.g. properties of a robot transferring the wafer, properties of a deflector used to scan electron beam on the wafer, etc.

For a case of the shift vector being greater than the threshold value, the controller can, in step 1040, control a robot (e.g. second robot 830). For example, the calculated shift vector can indicate that the wafer is shifted in Y direction by $Y_1$ distance units compared with the correct position, wherein $Y_1$ is greater than the threshold value. The controller can control the transfer of the wafer by making corresponding adjustments to motion of the robot performing wafer transfer.

For a case of the shift vector being smaller than the threshold value, the controller can, in step 1050, control beam location unit (e.g. beam location unit 840). For example, the calculated shift vector can indicate that the wafer is shifted in Y direction by $Y_2$ distance units compared with the correct position, wherein $Y_2$ is smaller than the threshold value. The controller can control a beam location unit to make corresponding adjustments to one or more primary electron beams of the electron beam tool.

The embodiments may further be described using the following clauses:

1. A system comprising:
   one or more sensing units configured to generate a signal based on a position of a sample; and
   a controller configured to:
   determine the position of the sample based on the signal; and
   in response to the determined position, provide information associated with the determined position for control of one of a first handling unit in a first chamber, a second handling unit in a second chamber, and a beam location unit in the second chamber.
2. The system of clause 1, wherein a sensing unit of the one or more sensing units comprises:
   an emitter configured to emit light; and
   a sensor configured to detect the emitted light.
3. The system of clause 2, wherein the one or more sensing units are positioned with respect to an edge of the sample, wherein the position of the sample is determined based on one or more sensors of the one or more sensing units detecting light emitted by one or more emitters of the one or more sensing units.
4. The system of any one of clauses 1-3, wherein the controller is further configured to determine an offset between the determined position and a reference position.
5. The system of clause 4, wherein the controller is further configured to control the first handling unit based on the determined offset, for a transfer of the sample between an interface and the first chamber.
6. The system of clause 4, wherein the controller is further configured to:
   in response to the determined offset being higher than a threshold value, control the second handling unit based on the determined offset, for a transfer of the sample between an interface and the second chamber; and
   in response to the determined offset being lower than or equal to the threshold value, control the beam location unit based on the determined offset, for a transfer of the sample between the interface and the second chamber.
7. The system of any one of clauses 1-6, wherein the position of the sample is determined during transfer of the sample between a vacuum environment and an atmospheric pressure environment.
8. The system of any one of clauses 1-7, wherein the determined position comprises spatial coordinates within a horizontal plane and a tilt angle with respect to the horizontal plane.
9. The system of any one of clauses 1-8, wherein the first chamber is an equipment front end module.
10. The system of any one of clauses 1-9, wherein the first handling unit is a robot.
11. The system of any one of clauses 1-10, wherein the second chamber is one of an electron beam inspection tool, a dimension scanning electron microscopy tool, a review scanning electron microscopy tool, or an electron beam direct write tool.
12. The system of any one of clauses 1-11, wherein the second handling unit is a robot.
13. The system of any one of clauses 1-12, wherein the beam location unit is scanning deflectors configured to control the position of an electron beam.
14. The system of any one of clauses 2-13, wherein the one or more sensing units comprise three sensing units, wherein each sensing unit comprises an emitter and a sensor.
15. The system of any one of clauses 2-13, wherein the one or more sensing units comprise five sensing units, wherein each sensing unit comprises an emitter and a sensor.
16. The system of any one of clauses 1-15, wherein the interface is a loadlock chamber.
17. The system of any one of clauses 1-16, wherein the sample is one of a wafer or a mask.
18. A method for determining a position of a sample in an interface between a first chamber and a second chamber, the method comprising:
   generating a signal based on the position of the sample;
   determining the position of the sample based on the signal; and
   in response to the determined position, providing information associated with the determined position for control of one of a first handling unit in the first chamber, a second handling unit in the second chamber or a beam location unit in the second chamber.
19. The method of clause 18, wherein generating a signal based on the position of the sample comprises:
   emitting light, by one or more emitters; and
   detecting the emitted light, by one or more corresponding sensors.
20. The method of any one of clauses 18 or 19, further comprising determining an offset between the determined position and a reference position.
21. The method of clause 20, further comprising controlling the first handling unit based on the determined offset, for a transfer of the sample between the interface and the first chamber.
22. The method of clause 20, further comprising:
   in response to the determined offset being higher than a threshold value, controlling the second handling unit based on the determined offset, for a transfer of the sample between the interface and the second chamber; and
   in response to the determined offset being lower than or equal to the threshold value, controlling the beam location unit based on the determined offset, for a transfer of the sample between the interface and the second chamber.
23. A non-transitory computer readable storage medium storing a set of instructions that is executable by one or more processors of a computing device to cause the computing device to perform a method comprising:
   receiving a signal from one or more sensory units, wherein the signal is based on a position of a sample in an interface between a first chamber and a second chamber;
   determining the position of the sample based on the received signal; and
   in response to the determined position, providing information associated with the determined position for control of one of a first handling unit in the first chamber, a second handling unit in the second chamber or a beam location unit in the second chamber.

24. The medium of clause 23, wherein the set of instructions that is executable by the one or more processors of the computing device to cause the computing device to further perform:
determining an offset between the determined position and a reference position.

25. The medium of clause 24, wherein the set of instructions that is executable by the one or more processors of the computing device to cause the computing device to further perform:
controlling the first handling unit based on the determined offset, for a transfer of the sample between the interface and the first chamber.

26. The medium of clause 24, wherein the set of instructions that is executable by the one or more processors of the computing device to cause the computing device to further perform:
in response to the determined offset being higher than a threshold value, controlling the second handling unit based on the determined offset, for a transfer of the sample between the interface and the second chamber; and
in response to the determined offset being lower than or equal to the threshold value, controlling the beam location unit based on the determined offset, for a transfer of the sample between the interface and the second chamber.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A system comprising:
one or more sensing units in an interface configured to generate a signal based on a sensed position of a sample;
a first handling unit in a first chamber configured to transfer the sample between the first chamber and the interface;
a second handling unit in a second chamber;
a beam location unit in the second chamber; and
a controller configured to:
determine the position of the sample based on the signal; and
in response to the determined position, control one of the first handling unit, the second handling unit, and the beam location unit to compensate for a shift in the position of the sample.

2. The system of claim 1, wherein the one or more sensing units comprises:
one or more emitters configured to emit light; and
one or more sensors configured to detect the emitted light, and/or
wherein the one or more sensing units are positioned along an edge of the sample, wherein the position of the sample is determined based on the one or more sensors detecting light emitted by the one or more emitters.

3. The system of claim 1, wherein the controller is further configured to:
determine an offset between the determined position and a reference position of the sample;
control the first handling unit based on the determined offset to transfer the sample between the interface and the first chamber;
in response to the determined offset being higher than a threshold value, control the second handling unit based on the determined offset to transfer the sample between the interface and the second chamber; and
in response to the determined offset being lower than or equal to the threshold value, control the beam location unit based on the determined offset.

4. The system of claim 1, wherein the position of the sample is determined during transfer of the sample between a vacuum environment and an atmospheric pressure environment.

5. The system of claim 1, wherein the determined position of the sample comprises spatial coordinates within a horizontal plane and a tilt angle with respect to the horizontal plane.

6. The system of claim 1, wherein the first chamber is an equipment front end module.

7. The system of claim 1, wherein the first handling unit is a robot, and/or wherein the second handling unit is a robot.

8. The system of claim 1, wherein the second chamber is one of an electron beam inspection tool, a dimension scanning electron microscopy tool, a review scanning electron microscopy tool, or an electron beam direct write tool.

9. The system of claim 1, wherein the beam location unit includes scanning deflectors configured to control the position of an electron beam.

10. The system of claim 1, wherein the interface is a loadlock chamber.

11. The system of claim 1, wherein the sample is one of a wafer or a mask.

12. A method for determining a position of a sample in an interface between a first chamber and a second chamber, the method comprising:
generating a signal based on a sensed position of the sample;
determining the position of the sample based on the signal; and
in response to the determined position, providing information associated with the determined position for control of one of a first handling unit in the first chamber, a second handling unit in the second chamber or a beam location unit in the second chamber to compensate for a shift in the position of the sample.

13. The method of claim 12, wherein generating the signal based on the position of the sample comprises:
emitting light, by one or more emitters; and
detecting the emitted light, by one or more corresponding sensors.

14. The method of claim 12, further comprising:
determining an offset between the determined position and a reference position of the sample; and controlling a first handling unit based on the determined offset to transfer the sample between the interface and the first chamber;
in response to the determined offset being higher than a threshold value, controlling a second handling unit based on the determined offset to transfer the sample between the interface and the second chamber; and
in response to the determined offset being lower than or equal to the threshold value, controlling a beam location unit based on the determined offset.

15. A non-transitory computer readable storage medium storing a set of instructions that is executable by one or more processors of a computing device to cause the computing device to perform a method of claim 12.

* * * * *